United States Patent [19]

Cohen

[11] 4,419,769

[45] Dec. 6, 1983

[54] DIGITAL TUNING SYSTEM FOR A VARACTOR TUNER EMPLOYING FEEDBACK MEANS FOR IMPROVED TUNING ACCURACY

[75] Inventor: Elias Cohen, El Paso, Tex.

[73] Assignee: General Instrument Corporation, Clifton, N.J.

[21] Appl. No.: 359,767

[22] Filed: Mar. 19, 1982

Related U.S. Application Data

[63] Continuation-in-part of Ser. No. 191,676, Sep. 29, 1980, abandoned, which is a continuation of Ser. No. 52,074, Jun. 25, 1979, abandoned, which is a continuation of Ser. No. 903,956, May 8, 1978, abandoned, which is a continuation-in-part of Ser. No. 664,710, Mar. 8, 1976, abandoned.

[51] Int. Cl.³ .............................................. H04B 1/16
[52] U.S. Cl. .................................. 455/182; 455/184; 455/186; 455/158
[58] Field of Search ............... 455/158, 164, 179, 182, 455/184–186; 358/191.1, 193.1, 195.1; 334/14–16

[56] References Cited

U.S. PATENT DOCUMENTS

| | | |
|---|---|---|
| 3,231,858 | 1/1966 | Tuomenoksa . |
| 3,594,765 | 7/1971 | LeRouge . |
| 3,611,437 | 10/1971 | Varadi et al. . |
| 3,613,055 | 12/1971 | Varadi et al. . |
| 3,644,904 | 2/1972 | Baker . |
| 3,715,746 | 2/1973 | Hatano . |
| 3,765,003 | 10/1973 | Paivinen et al. . |
| 3,778,815 | 12/1973 | Wright . |
| 3,798,617 | 3/1974 | Varadi et al. . |
| 3,851,254 | 11/1974 | Merrell et al. ................. 455/158 |
| 3,862,407 | 1/1975 | Baldauf et al. . |
| 3,961,266 | 6/1976 | Tanaka ........................... 455/184 |
| 3,968,440 | 7/1976 | Ehni .............................. 455/186 |
| 3,975,601 | 8/1976 | Whelan . |

OTHER PUBLICATIONS

"New Digital Color TV Tuning System" by Karl Savon, Radio Electronics, Dec. 1975.

Primary Examiner—Jin F. Ng
Attorney, Agent, or Firm—James & Franklin

[57] ABSTRACT

A tuning system for use in a communications receiver having a varactor tuner includes an alterable, non-volatile memory having a plurality of memory locations, each of which is capable of storing a first digital number representative of a tunable frequency. A signal selector actuates circuitry for selecting a memory location which senses a first digital number at the selected location. A feedback circuit senses the frequency to which the tuner is tuned and generates a second digital number, which represents the sensed frequency. The digital numbers are compared and an error signal generated in accordance with the difference. The tuned frequency of the tuner is varied in accordance with the error signal. The stored number at the selected location may be varied to provide a change in the fine tuning setting.

11 Claims, 3 Drawing Figures

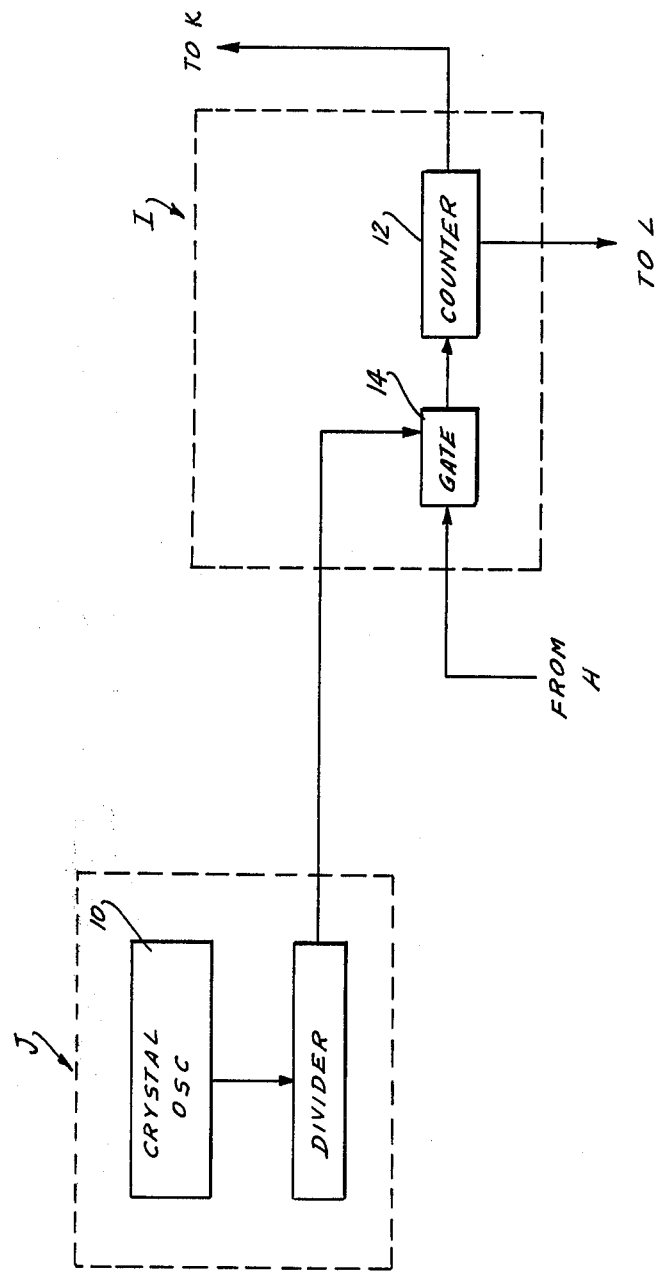

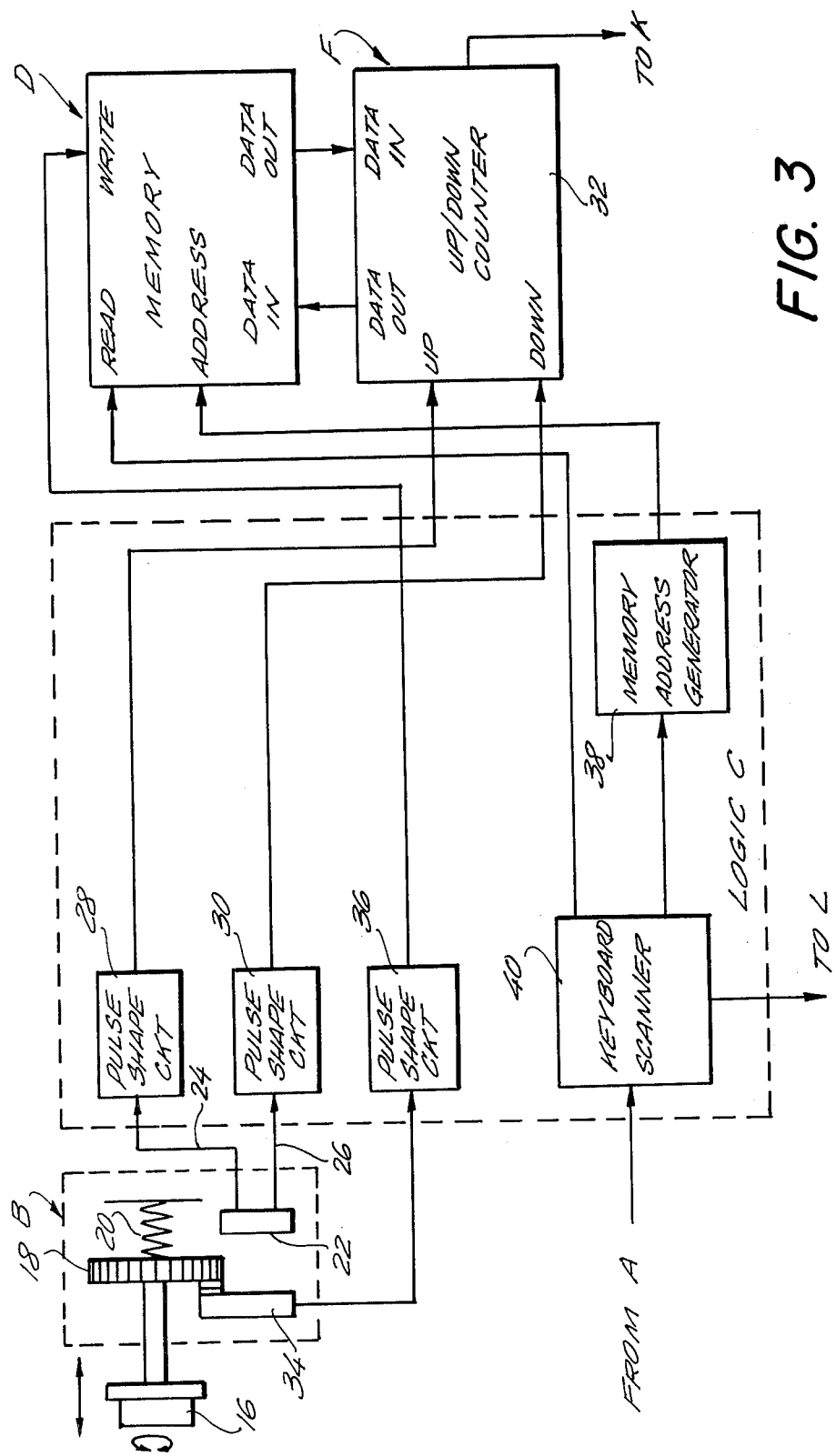

DIGITAL TUNING SYSTEM FOR A VARACTOR TUNER EMPLOYING FEEDBACK MEANS FOR IMPROVED TUNING ACCURACY

This application is a continuation-in-part of co-pending U.S. application Ser. No. 191,676 filed Sept. 29, 1980, which is a continuation of U.S. application Ser. No. 052,074, filed June 25, 1979 which is a continuation of U.S. application Ser. No. 903,956 filed May 8, 1978, which is a continuation-in-part of U.S. application Ser. No. 664,710, filed Mar. 8, 1976, all abandoned, all of which have the same title and are assigned to the same assignee.

The present invention relates to tuning systems for communications receivers and, more particularly, to a digital tuning system for use with a varactor tuner which employs feedback means for improved tuning accuracy.

The development of varactor tuners has recently provided an advantageous alternative to conventional electromechanical gang tuned variable condenser or inductor tuners for use in communications systems. A varactor tuner employs a signal controlled tuning element, usually a diode, the capacitance of which is variable in accordance with the input voltage thereto. This element is called a varactor, and is used to form a part of a resonant frequency circuit in the local oscillator. In this manner, the local oscillator frequency can be varied simply by changing the input voltage to the varactor.

However, because of the non-linearity of certain portions of the voltage-capacitance characteristic curve of a varactor, it is difficult, in certain frequency ranges, to generate the necessary varactor input voltage with sufficient accuracy to provide the required tuning resolution. Varactor controllers utilizing a plurality of preset resistance elements in conjunction with complex switching systems have been utilized to generate the varactor input voltages. Such systems, however, because of this non-linearity, require a large amount of space, are quite complex, and thus, are relatively expensive to manufacture, maintain and repair. In addition, such systems are subject to changes in environmental conditions such as temperature and humidity which reduce the accuracy thereof significantly.

A viable alternative to this type of system has recently been developed through the use of digital tuning systems which generate a tuning voltage on the basis of a digital data signal. Broadly considered, such systems fall into two categories and can be differentiated by the method employed to generate the local oscillator frequencies to enable receipt of the broadcast signals by a superheterodyne or other type of receiver. In one type of system which utilizes a frequency synthesis method, the local oscillator frequencies for a defined and predetermined group of signals are generated directly or indirectly for a closed loop controlled circuit from a single crystal or group of crystals which take into account the harmonic relationship or regularity of the spacing between the channels. This type of system can be addressed by a single digit or two digit code and has the basic advantage of frequency accuracy. However, it suffers from several disadvantages. First, in such a system, the tuning is relatively inflexible. If an optimum tuning point does not fall at the exact frequency, as may happen in TV reception, correction has to be applied by a frequency offset approach which, unless a non-volatile memory is employed, is not retained for future use. Further, offset correction is usually limited in scope and cannot correct for major errors. Second, the system suffers from an inability to accommodate new channels and services not anticipated in the design. Thus, the system either becomes obsolete or must be design upgraded through modernization to accommodate new channels and services. Third, the frequency synthesis system does not accommodate existing electronic tuners without redesign.

In a second type of digital tuning system, a digital memory is utilized wherein voltage information is stored and recalled upon command. Input voltages corresponding to the tuning frequencies of an associated electronic tuner are obtained from this stored information through the use of a digital-to-analog converter, the output of which conditions the tuner. Channel selection can be accomplished by different types of address systems. The address system interrogates the memory by means of a digital code and the tuning voltage associated with the required channel is generated so as to obtain the proper tuning frequency. One example of such a system is disclosed in U.S. Pat. No. 3,968,440, issued July 6, 1976 to George John Ehni III, entitled "SOLID STATE TELEVISION CHANNEL SELECTION SYSTEM." This system, however, does not utilize any feedback circuit to assure tuning accuracy and it employs a volatile memory which requires the continuous application of power to retain the stored data.

The recent development of an MNOS electronically programmable, non-volatile, word erasable semiconductor memory device has provided the basis for an alternative all electronic tuning system. Such memories have the capability of being programmed and erased on a word-by-word basis and are able to maintain the programming for periods of a minimum of ten years without requiring continuous application of electrical power. These memories are known in the art, see H. A. R. Wegener, et al., *The Variable Threshold Transistor, a New Electrically Alterable, Non-Destructive Read-Only Storage Device,* presented at the IEEE International Electron Devices Meeting, Washington, D.C. 1967; and G. C. Lockwood, C. T. Naber, T. K. Koo, *A 1024 Bit MNOS, Electrically-Alterable ROM,* presented at WESCON, Los Angeles, September, 1972.

A system of this type has the advantage of tuning flexibility in that the tuning can be optimized for any signal and new tuning voltages can be stored in the non-volatile memory. Thus, if a signal, because of unsophisticated equipment, is 2 MHz from the assigned frequency for a given channel, as sometimes occurs, the memory system can be reprogrammed permanently for the correct setting. Further, new services and channels can be accommodated. Since the memory stores numbers representative of tuning voltages, any frequency band can be accommodated provided that the analog voltage output capability of the digital-to-analog converter can tune an associated electronic tuner. Thus, the exact locations of channels within the band need not be specified. Further, a new frequency band can be accommodated merely by changing or adding a voltage addressable electronic tuner.

The disadvantage of such a non-volatile memory tuning system is that it requires a reasonably stable electronic tuner because it is an open loop system and depends for accuracy on the frequency repeatability of the tuner with impressed tuning voltage. While the tuning system can be made closed loop so that it upgrades the memory from a frequency discriminator circuit, it does not fully compensate for all frequency versus voltage errors which occur due to large temperature excursions after the equipment is turned off. This is the case in particular with an automotive AM varactor tuner which must operate within the temperature range of −20° C. (turn on in wintertime) to +75° C. (hot sun in summertime).

An attempt to remedy these problems is disclosed in U.S. Pat. No. 3,961,266, issued June 1, 1976 to Akio Tanaka, entitled "CHANNEL SEEKING TUNING SYSTEM." However, this system, which employs a somewhat crude feedback circuit, is capable of generating only a gross approximation of the sensed frequency for comparison with the stored data. Thus, the frequency is adjusted to an approximate value only and an AFC (automatic frequency control) circuit is required to obtain the desired frequency tuning.

The present invention is directed towards an all electronic tuning system for use with a varactor tuning element in communications systems which utilize aspects of both of the above-described all electronic tuning systems, and, therefore, has the advantages of each system. Thus, a digital tuning system is provided which has the inherent frequency accuracy of the synthesis approach and, in addition, retains the tuning flexibility of the non-volatile memory system.

It is, therefore, a prime object of the present invention to provide a digital tuning system for a varactor tuner employing feedback means for improved tuning accuracy wherein the tuner accuracy is enhanced by using a closed loop feedback system which provides an extremely accurate representation of the actual tuned frequency and utilizes same to adjust the tuned frequency.

It is a second object of the present invention to provide a digital tuning system for a varactor tuner employing feedback means for improved tuning accuracy wherein the data stored at a selected memory location is compared with an exact representation of the actual frequency to which the tuning element is tuned to produce an error signal representative of the difference therebetween.

It is another object of the present invention to provide a digital tuning system for a varactor tuner employing feedback means for improved accuracy wherein no secondary tuning means, such as an automatic frequency control circuit is required to obtain accurate tuning.

It is still another object of the present invention to provide a digital tuning system for a varactor tuner employing feedback means for improved tuning accuracy wherein the data representative of the frequencies to which the tuning element is tunable is stored in a reprogrammable non-volatile memory which is readily alterable to provide the necessary coarse and fine tuning adjustments.

It is a further object of the present invention to provide a digital tuning system for a varactor tuner including fine tuning means in the form of pulse generating means and a counter, the pulse generating means being capable of altering the data in the counter to fine tune the tuner.

It is still another object of the present invention to provide a digital tuning system for a varactor tuner employing feedback means for improved tuning accuracy which is manufactured exclusively of electronic components, fabricatable by known integrated circuit fabrication techniques in a relatively inexpensive manner such that it has improved reliability and requires a minimum amount of space within the communications system.

In accordance with the present invention, a tuning system for use in a communications receiver or the like of the type having a signal controlled tuning element is provided. The system includes means for storing a first digital number representative of a tuning frequency. A signal selector, preferably in the form of a keyboard having an array of actuatable switching devices, is utilized. Means are provided to address the storage means in accordance with the actuation of the signal selector. The address system includes means for reading the first digital number from the storage means. Means are also provided for altering the read first digital number to provide a fine tuning adjustment.

Means, operably connected to the varactor tuner, are provided for sensing the frequency to which the tuning element is tuned. Means are provided for converting the sensed frequency into a second digital number. Means are utilized to compare the first and second digital numbers and to generate an error signal, in accordance with the difference therebetween. The error signal is utilized to control the output of a voltage generator which is connected to the input of the varactor tuner. Thus, the tuned frequency is varied in accordance with the error signal.

The storage means preferably comprises a non-volatile memory having a plurality of storage locations, each of which contains a first digital number representative of the frequency of a different station, and a temporary memory in the form of a digital counter, operably connected to the memory. Means, operably connected to the non-volatile memory are provided for causing the first digital number at the storage location designated by the signal selector to be transferred to the counter when the selector is actuated. The counter is preferably an up/down digital counter having separate "up" and "down" clock inputs.

The altering means comprises a pulse generator and means for operably connecting the pulse generator to the counter. The pulse generator is effective, when actuated, to alter the first digital number present in the counter. The pulse generator generates pulses in two different modes. Each of the modes alters the number present in the counter in a different direction.

The pulse generator is provided with an actuation member which may be rotated in a clockwise or counterclockwise direction. When it is rotated in one direction, pulses are generated on one output. When the member is rotated in the other direction, pulses are generated on the other output. The number of pulses generated represents the angle of rotation. One output is connected to the "up" clock input of the counter and the other to the "down" clock input of the counter. Manipulation of the actuation member of the pulse generator, therefore, alters the number stored in the counter in a direction determined by the direction of rotation of the actuation member and to a magnitude determined by the angle of rotation.

The means for converting the sensed frequency into a second digital number comprises means for dividing the sensed carrier frequency of the tuner by a preselected number. Gating means, operably connected to the output of the dividing means, are provided. A timing circuit is operably connected to open the gating means for a preselected time interval. A counter is operably connected through the gating means to receive the output of the dividing means, during the preselected time interval, and to form the second digital number in accordance therewith.

The dividing means preferably takes the form of a pre-scaler. The timing circuit preferably comprises a crystal controlled counter. The counter preferably has a frequency read-out system.

The converting means insures that the second digital number is an accurate representation of the sensed frequency. This is important because the accuracy of the tuning signal which is generated depends on the signal representative of the difference between the digital numbers, which, in turn, depends upon the accuracy of the representation of the sensed frequency in the second digital number.

To the accomplishment of the above, and to such other objects as may hereinafter appear, the present invention relates to a digital tuning system for a varactor tuner employing feedback means for improved tuning accuracy as set forth in the annexed claims and described in the present specification, taken together with the accompanying drawings, wherein like numerals refer to like parts and in which:

FIG. 2 is a more detailed block diagram of the timing signal generator and frequency-to-digital converter of the present invention; and, FIG. 3 is a more detailed block diagram of control logic C.

Figure 1:
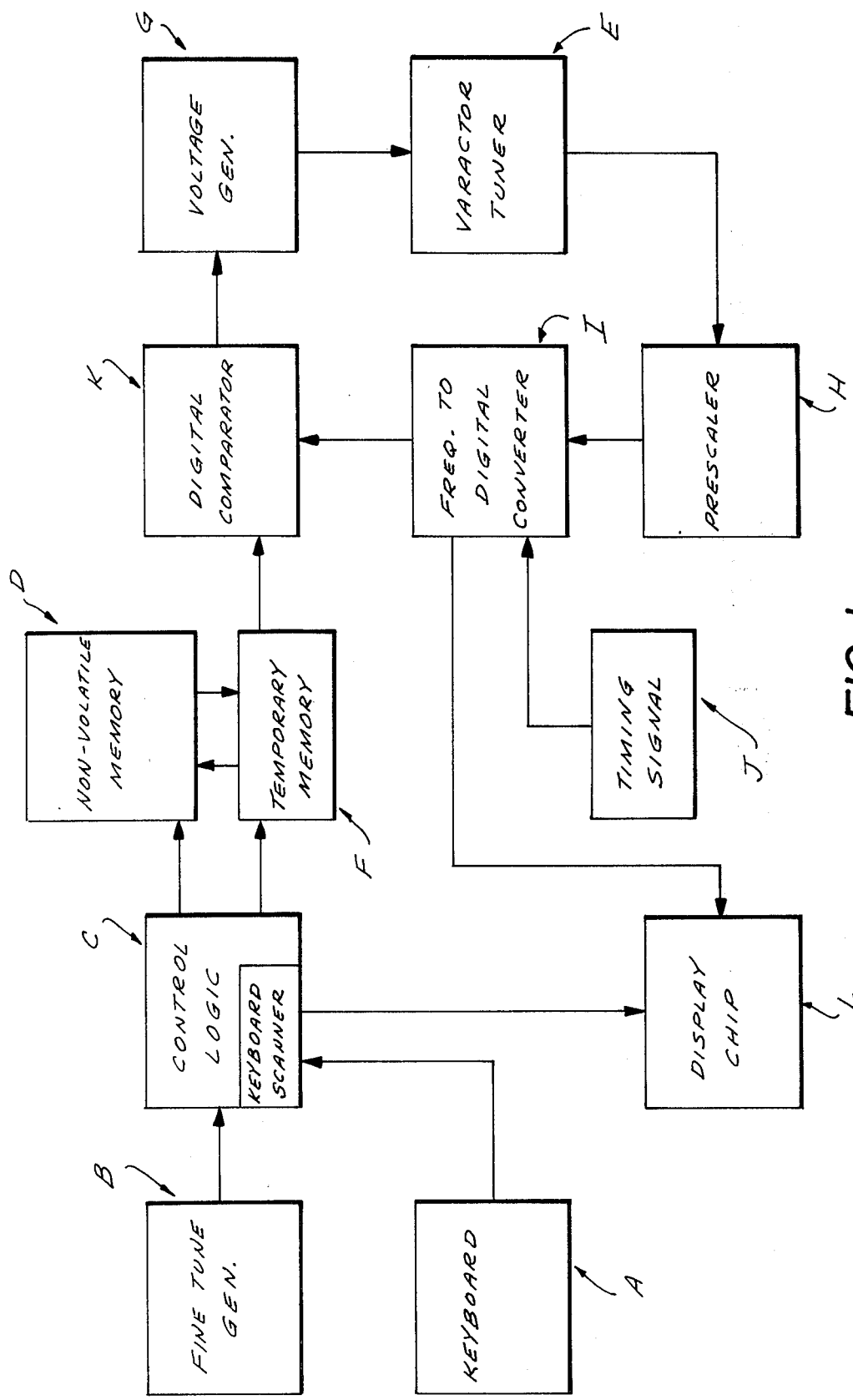
FIG. 1 is a block diagram of the overall system of the present invention.

The present invention is illustrated in the Figures by means of block diagrams because the individual components and circuits which make up this tuning system are conventional, per se, and thus known to those skilled in the art. Because it is not the structure of the components, but the manner in which they interact functionally to achieve a particular objective which is germane, block diagrams are utilized for reasons of simplicity and ease of understanding.

As seen in FIG. 1, the tuning system of the present invention has a pair of user accessible input means, one of which is in the form of a keyboard, generally designated A, of conventional design, and the other of which is in the form of a fine tune signal generator, generally designated B. Fine tune signal generator B preferably consists of a pulse generator which can generate pulses in one of two modes (up or down), and a signal indicating that the manipulation of the actuation member thereof has terminated. The structure of one such generator found to be particularly suitable for this application is a modification of the rotary switch described in detail in U.S. Pat. No. 3,975,601, issued Aug. 17, 1976.

The actuation of keyboard A by the depressing of the particular pushbuttons in the pushbutton array which correspond to the desired channel, causes the generation of channel select signals to a keyboard scanner circuit which forms a portion of the control logic circuit, generally designated C. The keyboard scanner circuit encodes the channel select signals to form address signals for addressing the memory, generally designated D, which are decoded and utilized to select the appropriate memory location within the memory D corresponding to the actuation of keyboard A.

Control logic chip C contains a keyboard scanner and encoder, the appropriate address circuitry for addressing non-volatile memory D, in accordance with the actuation of keyboard A, as well as circuitry for controlling the read and write functions of non-volatile memory D. Also included is circuitry designed to perform the timing functions necessary to coordinate the operations of the system. The different portions of control logic C are illustrated in FIG. 3. This circuit is the type of circuit which is routinely designed for systems of this type to perform the required functions in well known ways and the techniques involved in designing such a circuit are simple applications of well known basis logic techniques, within the skill of one of ordinary skill in the art of digital circuit design.

The following patents disclose representative circuits of the type encompassed within control logic chip C:

U.S. Pat. No. 3,231,858—Tuomenoksa, et al., dated Jan. 25, 1966, which discloses encoding networks;

U.S. Pat. No. 3,715,746—Hatano, which discloses in detail one form of an encoding circuit, designed for use in conjunction with a keyboard, in which the actuation of the keyboard is translated into electronic signals on which arithmetic operations can be performed;

U.S. Pat. No. 3,757,398—Hashizume, et al., issued Sept. 4, 1973, wherein is shown an encoder circuit 46 utilized to encode signals generated by a keyboard in order to address a memory 47, as well as the output control circuit 49;

U.S. Pat. No. 3,778,815—Wright, issued Dec. 11, 1973, wherein is shown a circuit for translating the depression of a key to a four bit code representing the key characters;

U.S. Pat. No. 3,862,407—Baldauf, et al., issued Jan. 21, 1975, which discloses a decimal-to-binary converter wherein signals from a keyboard are converted into a binary output;

U.S. Pat. No. 3,798,617—Varadi, et al., issued Mar. 9, 1974, which relates to a permanent storage memory and discloses therein means for addressing same and for controlling same to perform the read and write operations;

U.S. Pat. No. 3,611,436—Varadi, issued Oct. 5, 1971, wherein specific circuitry for addressing and interrogating a read only memory is disclosed;

U.S. Pat. No. 3,765,003 to Paivinen, et al. issued Oct. 9, 1973, wherein specific circuitry for addressing a random access memory, as well as for reading, writing and refreshing the data therein, is disclosed in detail;

U.S. Pat. No. 3,613,055 to Varadi, issued Oct. 12, 1971, which discloses in detail a memory address and control circuit; and U.S. Pat. No. 3,644,904—Baker, issued Feb. 22, 1972, which relates to a control circuit wherein the decoding of the chip select signal inhibits the write command for all but the appropriate chip.

The above list is merely representative of the voluminous number of patents which disclose a variety of different encoder circuits for use with keyboards and circuits which are utilized to address and control the movement of information within a memory as well as to and from the memory. One skilled in the art, knowing the functional requirements of applicant's system, could easily choose one or more of the circuits disclosed in the above patents and make obvious modification to same, if necessary, to produce a circuit which performs in the manner required.

Further, the fundamentals of all of the circuit design techniques which are required to design control chip C are set forth in:

1. "Theory and Design of Digital Machines" Bartell, DeBow and Reid (McGraw-Hill)

2. "Introduction to Switching, Theory Logic and Design" F. Hill, J. Peterson (John Wiley & Sons)
3. "Digital Networks and Computer Systems" T. Booth (John Wiley & Sons)
4. "Designing With TTL Integrated Circuits" R. Morse, J. Miller (McGraw-Hill)

Memory D is an MNOS electronically programmable, non-volatile, word erasable semiconductor memory device. This memory has the capability of being programmed and erased on a word-by-word basis and is able to maintain the programming for periods of a minimum of ten years, without requiring continuous application of electrical power. Memory D is provided with a plurality of storage locations, each of which is capable of storing a data word which is representative of the frequency of a channel or station to which the varactor tuning element, generally designated E, is tunable.

Once addressed, the data word at the selected memory location is sensed and read out into a temporary memory, generally designated F, preferably in the form of a reversible binary counter of standard construction. This circuit may comprise an up/down binary counter or a polynomial counter, in the form of shift registers, connected with an exclusive OR gate. A polynomial counter of this type is described in detail in U.S. Pat. No. 3,594,765, issued July 20, 1971 to Lerouge. Such are commercially available from a number of sources, for example, Fairchild Catalog No. 3347.

The data word stored within temporary memory F can be altered through the use of fine tune signal generator B. Fine tune signal generator B has an actuation member which is depressable to permit alteration of the data stored in temporary memory F. The member, once depressed, is rotatable in a clockwise or counterclockwise direction so as to alter the data word stored in temporary memory F in either direction. When the actuation member is released, the altered data word present in temporary memory F is automatically loaded into non-volatile memory D at the addressed location such that the altered fine tune setting is preserved for future use.

The input voltage to condition the varactor tuner E is provided by means of a voltage generator, generally designated G, which generates an output voltage which scans the range of the varactor tuner E until the feedback loop indicates a match between the actual frequency of the varactor tuner E and the desired frequency as represented by the first digital member stored in temporary memory F.

Voltage generator G is merely a controllable direct current source, such as a ramp generator, a multitude of forms of which are known in the art. Such circuits are commercially available from a number of sources, for example, Fairchild Catalog No. 9602, or can be fashioned from commercially available components, such as Fairchild Catalog No. 741, a resistor and a capacitor, connected in a known fashion.

The feedback loop includes a pre-scaler, generally designated H, which is operatively connected to varactor tuner E to sense the carrier frequency to which the varactor tuner is tuned. Pre-scaler H divides the tuned frequency by a preselected number and generates the result of this division to a frequency-to-digital converter, generally designated I. Frequency-to-digital converter I receives an accurately formulated timing signal from a timing signal generator, generally designated J, preferably in the form of a crystal controlled counter 10, as seen in FIG. 2. Converter I comprises a frequency readout system including a binary counter 12, the input of which receives the output of pre-scaler H through a gating means 14 which is controlled by the timing signal from timing signal generator J. The timing signal from timing signal generator J serves to open the gating means 14 for a precise time interval such that the counter 12 will count the number of pulses received from prescaler H in a given time interval. In this manner, the binary count on the counter 12 is an accurate digital representation of the carrier frequency to which the varactor tuner E is tuned.

The output of converter I is transferred to a digital comparator, generally designated K, which also receives the output of temporary memory F, which is the first digital number representing the frequency of the channel or station selected for reception. Comparator K compares the digital input from converter I with the digital input from memory F and generates an error signal which contains information relating to the magnitude and direction of the difference between these two digitized inputs. The error signal generated from comparator K is fed to voltage generator G and utilized to vary the voltage output thereof such that the frequency to which the varactor tuner E is tuned matches the frequency which is represented by the stored data.

A display chip, generally designated L, of conventional design, is provided operably connected to control logic chip C and converter I. When the tuning system is used in a television, the control chip will display channel indicia indicative of the tuned channel. This is accomplished through the use of the decoded signal which is fed from the control logic chip to the display chip wherein it is displayed by means of light emitting diodes or any other conventional display. When the tuning system of the present invention is used in conjunction with a radio receiver, station numbers can be displayed in a similar manner. As an alternative, the display chip L can be utilized to display a digital signal representative of the actual frequency to which the varactor tuner is tuned.

As seen in FIG. 3, fine tuning generator B is a pulse generator capable of generating pulses in one of two modes. Fine tune generator B may take a variety of forms but is preferably a modification of the rotary switch disclosed in detail in U.S. Pat. No. 3,975,601 and the reader is referred to that patent for a detailed description of the switch in question. However, in general, the switch comprises an actuation member 16 which is accessible from the exterior of the switch and may be depressed and rotated in either a clockwise or counterclockwise direction. Actuation member 16 comprises, at the end thereof, a detent wheel 18. Behind detent wheel 18 is a spring 20 which functions to bias actuation member 16 towards its undepressed position. When depressed, detent wheel 18 aligns with a contact element 22.

Contact element 22 has two outputs and generates a series of pulses on one of the outputs when the actuation member 16 is depressed and rotated. The output upon which the pulses appear depends upon the direction of rotation of the actuation member. Thus, for example, a counterclockwise rotation may cause pulses to be generated on output 24, whereas a clockwise rotation may cause pulses to be generated on output 26. The number of pulses generated is determined by the angular degree or extent of the rotation of member 16.

Outputs 24 and 26 form the inputs to pulse shaping circuits 28 and 30, respectively, located in control logic C. Pulse shaping circuits 28 and 30 are of conventional design, including a debouncing circuit and a circuit for adjusting the amplitude of the pulses, such that same can be received by the clock inputs of an up/down digital counter 32, of conventional design, which forms temporary memory F. The output of pulse shaping circuit 28 is connected to the "up" clock input of counter 32. Similarly, the output of pulse shaping circuit 30 is connected to the "down" clock input of counter 32.

Fine tuning generator B is also provided with a normally opened switch 34 which, when closed by the movement of actuation member 16 to the undepressed position, will generate a single pulse of predetermined duration to a third pulse shaping circuit 36 within control logic C. The structure of pulse shaping circuit 36 is similar to that of circuits 28 and 30 and contains debouncing circuitry, as well as a circuit to alter the amplitude of the pulse. When actuation member 16 is released, such that spring 20 causes the member to return to its undepressed position, switch 34 generates a single pulse to the input of pulse shaping circuit 36 which, in turn, generates a pulse to the "write" input of memory D. This pulse causes memory D to write the number applied to the "data-in" input thereof into the previously selected storage location in memory D.

The storage location in memory D is selected in accordance with the output of an address generator 38 present in control logic C. Address generator circuit 38 is a standard circuit, many forms of which are known in the art. The particular form selected is determined by the requirements of the particular memory D which is utilized. The input of address generator circuit 38 is connected to the output of keyboard scanner 40, which also comprises a portion of control logic C. The other output of keyboard scanner 40 is connected to the "read" input of memory D. A "read" signal is generated from the keyboard scanner 40 to the read input of memory D upon completion of the actuation of keyboard A, in a manner conventional for such circuits.

Operation of the system is commenced by the depression of keys on keyboard A, which is connected to keyboard scanner 40. When actuation of the keyboard is complete, the selection is coded and the encoded signals are applied to the input of the memory address generator circuit 38. Address generator circuit 38 generates address signals to memory D such that the storage location corresponding to the depressed keys is selected. At the same time, keyboard scanner 40 generates a "read" signal to the read input of memory D, causing memory D to read the first digital number (representative of the desired tuning frequency) from the addressed location, and transfer same to the "data-out" output of memory D. The "data-out" output of memory D is connected to the "data-in" input of temporary memory F which comprises up/down binary counter 32. In this manner, the first digital number, representative of the frequency of the desired channel or station is located, retrieved and entered into counter 32.

The number in counter 32 is transferred to digital comparator K which compares same to the second digital number, representative of the carrier frequency to which the varactor tuner is tuned. Digital comparator K generates an analog error signal to the input of voltage generator G. The analog error signal has a magnitude representative of the difference between the first and second digital numbers and a sign representative of the direction of the difference. Voltage generator G generates the tuning voltage to varactor tuner E, causing varactor tuner E to tune a frequency which is equal to the frequency represented by the first digital number stored in counter 32.

If the frequency tuned by varactor tuner E requires fine tuning, fine tune generator B is utilized to alter the number present in counter 32 and, thus, the tuning voltage. This is accomplished by depressing actuation member 16 and rotating same either clockwise or counterclockwise, depending upon the direction of the required adjustment. The degree of rotation determines the magnitude of the adjustment.

Rotation in one direction will cause pulses to be applied to the "up" clock input of counter 32 which will increase the number stored therein. On the other hand, rotation in the other direction will cause pulses to be applied to the "down" clock input of counter 32, decreasing the word stored in the counter. When the number in counter 32, and thus the tuning voltage output of voltage generator G, have been satisfactorily adjusted, the actuation member 16 is released. Releasing actuation member 16 permits spring 20 to return the actuation member to the undepressed position.

When actuation member 16 returns to the undepressed position, switch 34 is actuated to generate a single pulse, through pulse shaping circuit 36, to the "write" input of memory D. This causes memory D to write, into the previously selected storage location, the now altered number in counter 32. Entering the altered number into the selected location erases the number previously stored therein. As a result, the fine tuning adjustment is preserved for future use.

The present invention, therefore, is a digital tuning system for use with a varactor tuner wherein excellent frequency stability is acheived through the use of a feedback loop. The memory stores a digitized representation of the desired frequency in the form of a first digital number. The actual frequency of the varactor tuner is monitored and converted into a second digital number which is an accurate representation of the sensed carrier frequency. The second digital number is compared to the stored data in order to obtain an error signal to provide accurate tuning. In this manner, the system continuously checks the memory and upgrades the tuning voltage to correspond to a frequency equal to the appropriate digital frequency information in the memory. In addition, the system employs a non-volatile alterable memory wherein the digitized representation of the desired frequency can be altered to preserve fine tune information as well as to provide extensive flexibility to add or change channels.

While only a single embodiment of the present invention has been disclosed herein for purposes of illustration, it is obvious that many modifications and variations could be made thereto. It is intended to cover all of these modifications and variations which fall within the scope of the present invention as defined by the following claims.

I claim:

1. A tuning system for use in a communications receiver or the like of the type having a signal controlled tuning element, said system comprising means for storing a plurality of first digital numbers representative of respective tuning frequencies, a signal selector, a temporary memory, means for addressing said storage means, in accordance with the actuation of said signal selector, to select one of said first digital numbers and transfer same to said temporary memory, user actuatable means for altering the contents of said temporary memory to provide a fine tuning adjustment, said altering means comprising an actuation member, said actuation member being rotatable, to alter the contents of said temporary memory, and displaceable to cause the contents of said temporary memory to be written into said storage means at said addressed location, means for sensing the frequency at which said element is tuned, means for converting said sensed frequency into a second digital number, means for comparing the contents of said temporary memory and said second digital number for generating a signal representative of the difference therebetween, and means, operably connected to said comparing means, for generating a tuning signal in accordance with said difference signal, said tuning signal being applied to said element to control same.

2. The system of claim 1, wherein said altering means comprises a pulse generator capable of generating pulses on two separate outputs, said actuation member being rotatable in one of two directions so as to select the output upon which pulses are generated.

3. The system of claim 2, wherein the number of said pulses generated on said selected output is a function of the degree of rotation of said actuation member.

4. The system of claim 3, wherein said temporary memory comprises an up/down counter having first and second inputs, each of which is operably connected to a different one of the outputs of said pulse generator.

5. The system of claim 4, wherein said actuation member is spring-loaded and depressable against the action of said spring to actuate said pulse generator and releasable to cause the contents of said temporary memory to be written into said storage means at said addressed location.

6. The system of claim 1, wherein said converting means comprises means for dividing said sensed frequency by a preselected number.

7. The system of claim 6, wherein said converting means further comprises gating means, operably connected to the output of said dividing means, and a timing circuit operably connected to open said gating means for a preselected time interval.

8. The system of claim 7, wherein said converting means further comprises a counter operably connected through said gating means to receive the output of said dividing means during said preselected time interval and to form said second digital number in accordance therewith.

9. The system of claim 8, wherein said counter further comprises a frequency readout system.

10. The system of claim 7, wherein said timing circuit comprises a crystal controlled counter.

11. The system of claim 6, wherein said dividing means comprises a pre-scaler.

* * * * *